(12) United States Patent
Pagaila et al.

(10) Patent No.: US 8,003,445 B2
(45) Date of Patent: Aug. 23, 2011

(54) INTEGRATED CIRCUIT PACKAGING SYSTEM WITH Z-INTERCONNECTS HAVING TRACES AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 165 days.

(21) Appl. No.: 12/412,312

(22) Filed: Mar. 26, 2009

(65) Prior Publication Data

US 2010/0244232 A1 Sep. 30, 2010

(51) Int. Cl.
*H01L 21/00* (2006.01)
*H01L 23/48* (2006.01)

(52) U.S. Cl. ........ 438/123; 257/692; 257/773; 257/786; 257/E21.502; 257/E21.505; 257/E23.01; 257/E23.116; 257/E23.141

(58) Field of Classification Search .......................... None
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,726,493 A | 3/1998 | Yamashita et al. | |
| 5,841,193 A | 11/1998 | Eichelberger | |
| 6,159,767 A | 12/2000 | Eichelberger | |
| 6,309,912 B1 | 10/2001 | Chiou et al. | |
| 6,356,453 B1 * | 3/2002 | Juskey et al. | 361/760 |
| 6,495,912 B1 | 12/2002 | Huang et al. | |
| 6,614,104 B2 | 9/2003 | Farnworth et al. | |
| 6,847,109 B2 | 1/2005 | Shim | |
| 6,946,325 B2 | 9/2005 | Yean et al. | |
| 6,987,661 B1 | 1/2006 | Huemoeller et al. | |
| 7,018,866 B2 | 3/2006 | Sugaya et al. | |
| 7,084,513 B2 | 8/2006 | Matsuki et al. | |
| 7,208,345 B2 | 4/2007 | Meyer et al. | |
| 7,294,587 B2 | 11/2007 | Asahi et al. | |
| 7,312,405 B2 | 12/2007 | Hsu | |
| 7,334,326 B1 | 2/2008 | Huemoeller et al. | |
| 7,361,533 B1 | 4/2008 | Huemoeller et al. | |
| 7,429,786 B2 | 9/2008 | Karnezos et al. | |
| 7,619,901 B2 | 11/2009 | Eichelberger et al. | |
| 7,675,157 B2 * | 3/2010 | Liu et al. | 257/690 |
| 2005/0184377 A1 | 8/2005 | Takeuchi et al. | |
| 2006/0197210 A1 | 9/2006 | Kim | |
| 2008/0029858 A1 | 2/2008 | Merilo et al. | |
| 2008/0157402 A1 | 7/2008 | Ramakrishna et al. | |
| 2009/0315170 A1 | 12/2009 | Shim et al. | |
| 2010/0006994 A1 | 1/2010 | Shim et al. | |
| 2010/0230806 A1 * | 9/2010 | Huang et al. | 257/723 |

OTHER PUBLICATIONS

U.S. Appl. No. 12/236,445, filed Sep. 23, 2008, Ha et al.
U.S. Appl. No. 12/411,154, filed Mar. 25, 2009, Huang et al.

* cited by examiner

*Primary Examiner* — Alonzo Chambliss
(74) *Attorney, Agent, or Firm* — Mikio Ishimaru (57) ABSTRACT

A method of manufacture of an integrated circuit packaging system includes: providing a carrier; mounting an integrated circuit on the carrier; mounting a z-interconnect on the carrier, the z-interconnect for supporting a trace cantilevered over the integrated circuit; encapsulating the integrated circuit with an encapsulation; removing the carrier; and depositing a substrate below the integrated circuit.

16 Claims, 9 Drawing Sheets

INTEGRATED CIRCUIT PACKAGING SYSTEM WITH Z-INTERCONNECTS HAVING TRACES AND METHOD OF MANUFACTURE THEREOF

TECHNICAL FIELD

The present invention relates generally to an integrated circuit packaging system and more particularly to a system for utilizing z-interconnects having traces in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses, and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a carrier; mounting an integrated circuit on the carrier; mounting a z-interconnect on the carrier, the z-interconnect for supporting a trace cantilevered over the integrated circuit; encapsulating the integrated circuit with an encapsulation; removing the carrier; and depositing a substrate below the integrated circuit.

The present invention provides an integrated circuit packaging system including: a substrate; an integrated circuit mounted on the substrate; a z-interconnect mounted on the substrate, the z-interconnect for supporting a trace cantilevered over the integrated circuit; and an encapsulation encapsulating the integrated circuit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
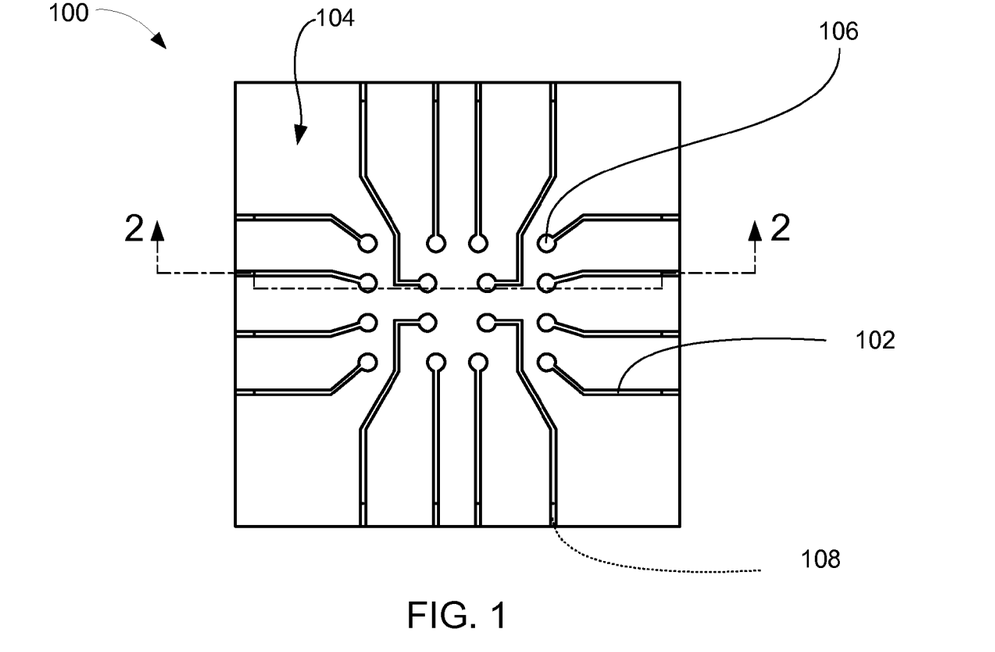
FIG. 1 is a top view of an integrated circuit packaging system in a first embodiment of the present invention.

Referring now to FIG. 1, therein is shown a top view of an integrated circuit packaging system 100 in a first embodiment of the present invention. The integrated circuit packaging system 100 is shown having traces 102. The traces 102 are partially encapsulated by an encapsulation 104 leaving contact points such as pads 106 exposed from the encapsulation 104. The traces 102 also contain z-interconnects 108. The z-interconnects 108 are defined as: electrically conductive structures, which rout data from one horizontal plane to a point on a different horizontal plane.

The traces 102 connect the pads 106 to the z-interconnects 108 by routing them in an optimal way taking into consideration various factors such as conduction path length, external component terminal configurations, as well as various other factors. Routed is defined as configuring the selected paths along which information is to be sent. In the present invention routed is defined and implemented as: configuring the pads 106 to connect to external devices with various terminal configurations, and configuring the traces 102 to connect with the z-interconnects 108. Configured is defined as: an arrangement of the pads 106 to align with a particular arrangement of interconnects of an external device or interface.

Configuring the pads 106 and the traces 102 reduces cost and production time by eliminating other components such as laminated interposers or buildup layers which would otherwise be used to interface with external components.

Figure 2:
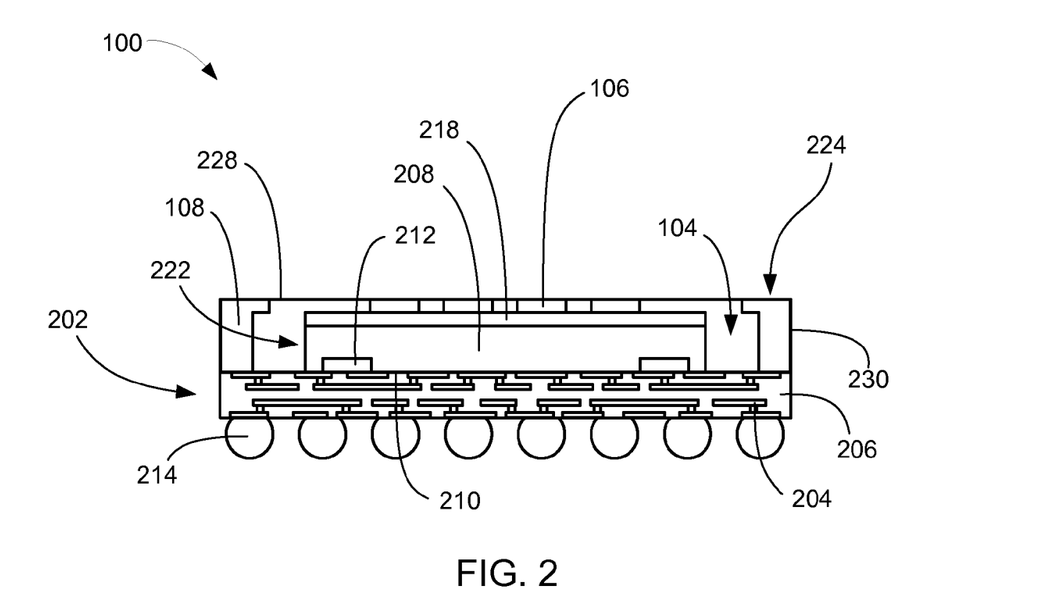
FIG. 2 is a cross-sectional view of the integrated circuit packaging system along the line 2--2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a buildup layer. The buildup layer may be produced through alternating lithography processes, metallization, etch, and dielectric deposition processes.

This may produce a substrate 202 having conducive traces 204 isolated by a dielectric 206 such as a low-k dielectric. Mounted above the substrate 202 is an integrated circuit 208 such as a flip chip with an active side 210.

The active side 210 of the integrated circuit 208 faces the substrate 202 and has contact pads 212, which are connected to the conductive traces 204 of the substrate 202. Below the substrate 202 external interconnects 214 such as solder balls are formed and connect to the conductive traces 204 of the substrate 202.

Mounted above the integrated circuit 208 are the pads 106. The pads 106 are attached to the integrated circuit 208 with a die attach adhesive 218.

The z-interconnects 108 are mounted along a side 222 of the integrated circuit 208. z-interconnects 108 connect the pads 106 above the integrated circuit 208 to the conductive traces 204 of the substrate 202.

The pads 106 of the pads 106 are routed above the integrated circuit 208, and may be configured to connect to external devices with different terminal configurations. The z-interconnects 108 may surround the integrated circuit 208 in a single row 224. The pads 106 may be configured directly above the integrated circuit 208.

The integrated circuit 208 is encapsulated with the encapsulation 104. The encapsulation 104 has an upper surface 228 which is level with the pads 106 exposing the pads 106 from the encapsulation 104. The encapsulation 104 fills between the integrated circuit 208 and the z-interconnects 108.

The z-interconnects 108 are also exposed from the encapsulation 104 creating an exposed side 230 on the z-interconnects 108. The exposed side 230 of the z-interconnect 108 may be used as an additional external connection point when integrating the integrated circuit packaging system 100 into a board level system.

Figure 3:
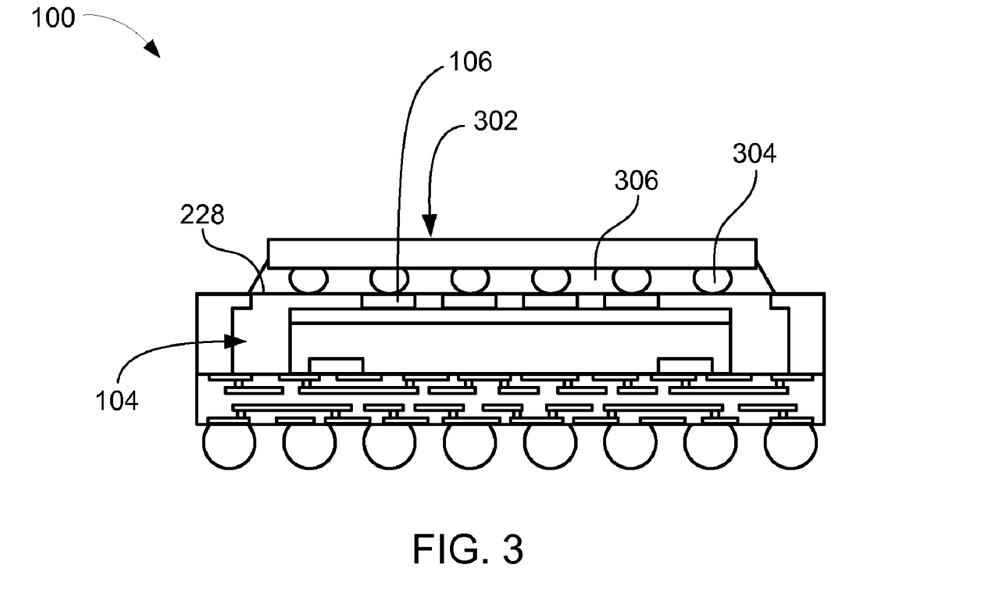
FIG. 3 is the integrated circuit packaging system of FIG. 2 after a device mounting phase of manufacture.

Referring now to FIG. 3, therein is shown the integrated circuit packaging system 100 of FIG. 2 after a device mounting phase of manufacture. The integrated circuit packaging system 100 is shown having an external device 302 such as a flip chip, a wire-bonded package, a wafer level chip scale package, or passive components, mounted above the pads 106.

The external device 302 has a terminal configuration 304 such as an arrangement of solder balls which connect to the pads 106. Between the external device 302 and the upper surface 228 of the encapsulation 104 is an underfill 306. The underfill 306 adds structural rigidity increasing package life.

Figure 4:
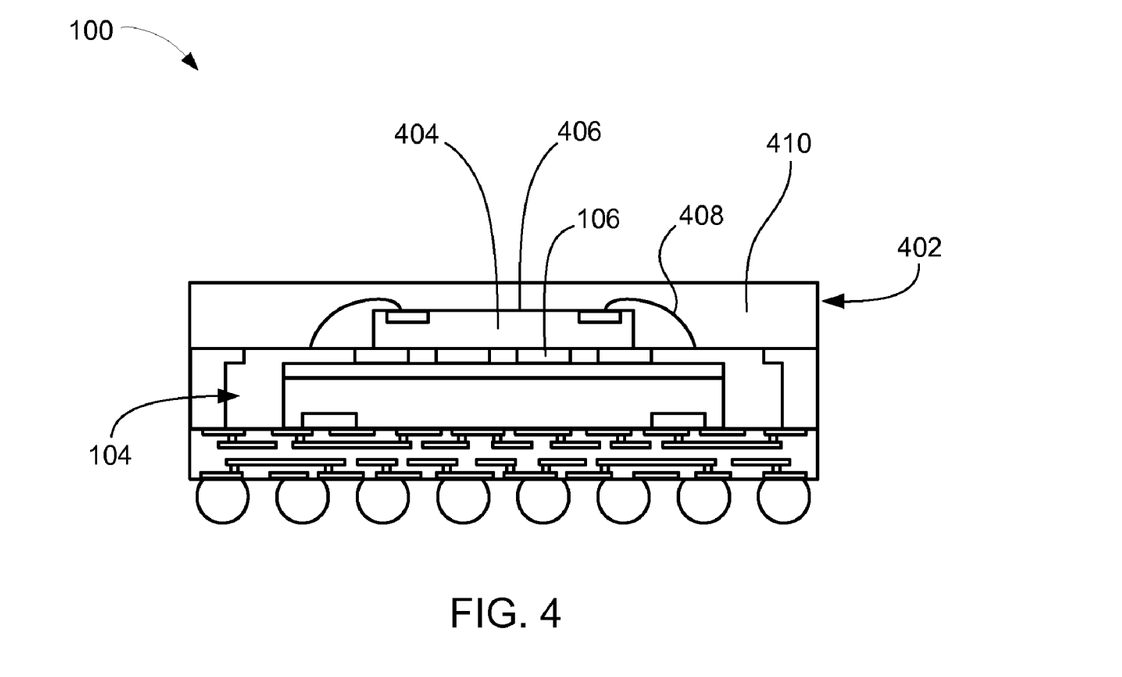
FIG. 4 is the integrated circuit packaging system of FIG. 2 after a device mounting phase of manufacture.

Referring now to FIG. 4, therein is shown the integrated circuit packaging system 100 of FIG. 2 after a device mounting phase of manufacture. The integrated circuit packaging system 100 is shown having an external device 402 mounted above the encapsulation 104. The molded devise has a wire-bonded die 404 with an active side 406. The active side 406 of the wire-bonded die 404 is connected to the pads 106 with bond wires 408. The wire-bonded die 404 is encapsulated by an external encapsulation 410.

Figure 5:
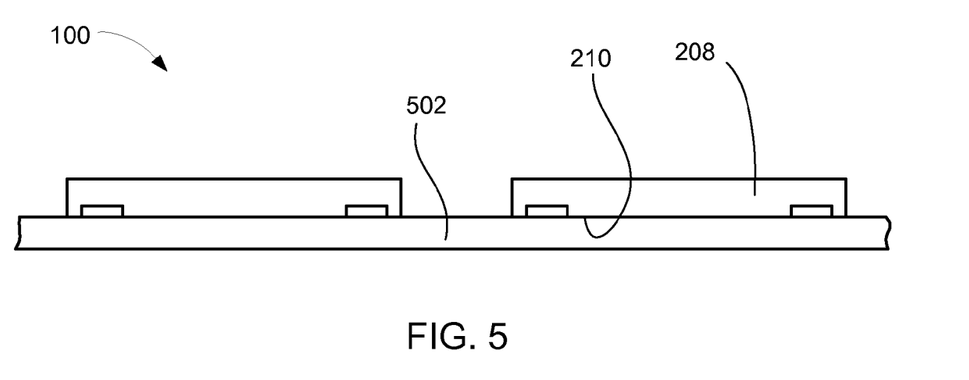
FIG. 5 is the integrated circuit packaging system of FIG. 2 after a chip attach phase of manufacture.

Referring now to FIG. 5, therein is shown the integrated circuit packaging system 100 of FIG. 2 after a chip attach phase of manufacture. The integrated circuit packaging system 100 is shown having a carrier 502, such as a wafer or a wafer level carrier, with the integrated circuit 208 mounted above and the active side 210 facing the carrier 502.

Figure 6:
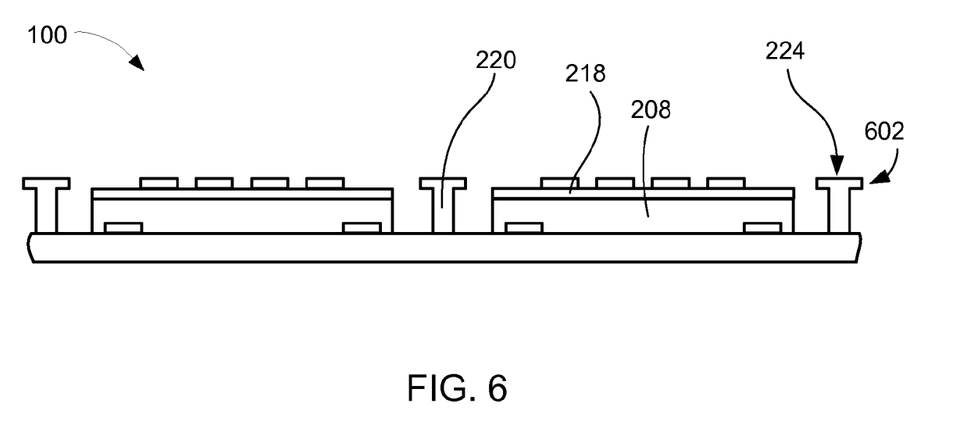
FIG. 6 is the integrated circuit packaging system of FIG. 2 after a frame mounting phase of manufacture.

Referring now to FIG. 6, therein is shown the integrated circuit packaging system 100 of FIG. 2 after a frame mounting phase of manufacture. The integrated circuit packaging system 100 is shown having the leadframe 602 attached to the integrated circuit 208 with the die attach adhesive 218. The z-interconnects 108 are also shown surrounding the integrated circuit 208 in the single row 224.

Figure 7:
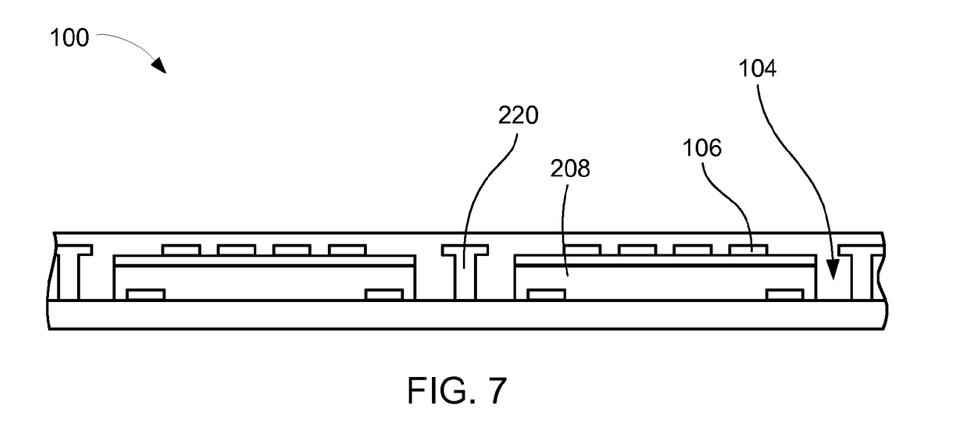
FIG. 7 is the integrated circuit packaging system of FIG. 2 after an encapsulation phase of manufacture.

Referring now to FIG. 7, therein is shown the integrated circuit packaging system 100 of FIG. 2 after an encapsulation phase of manufacture. The integrated circuit packaging system 100 is shown having the encapsulation 104 encapsulating the pads 106, the z-interconnects 108, and the integrated circuit 208.

Figure 8:
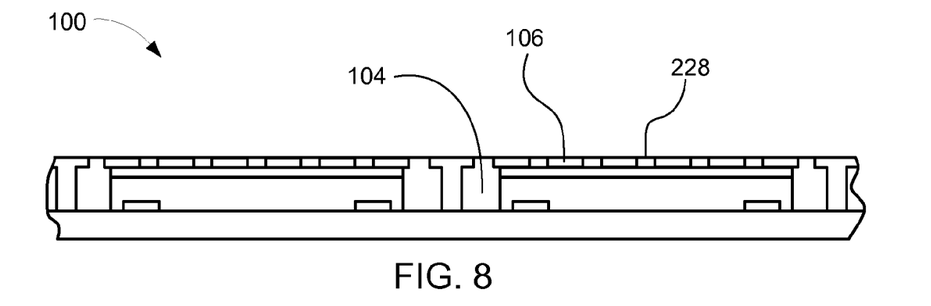
FIG. 8 is the integrated circuit packaging system of FIG. 2 after a planarizing phase of manufacture.

Referring now to FIG. 8, therein is shown the integrated circuit packaging system 100 of FIG. 2 after a planarizing phase of manufacture. The integrated circuit packaging system 100 is shown having the upper surface 228 of the encapsulation 104 planarized level with the pads 106 exposing the pads 106 from the encapsulation 104.

Figure 9:
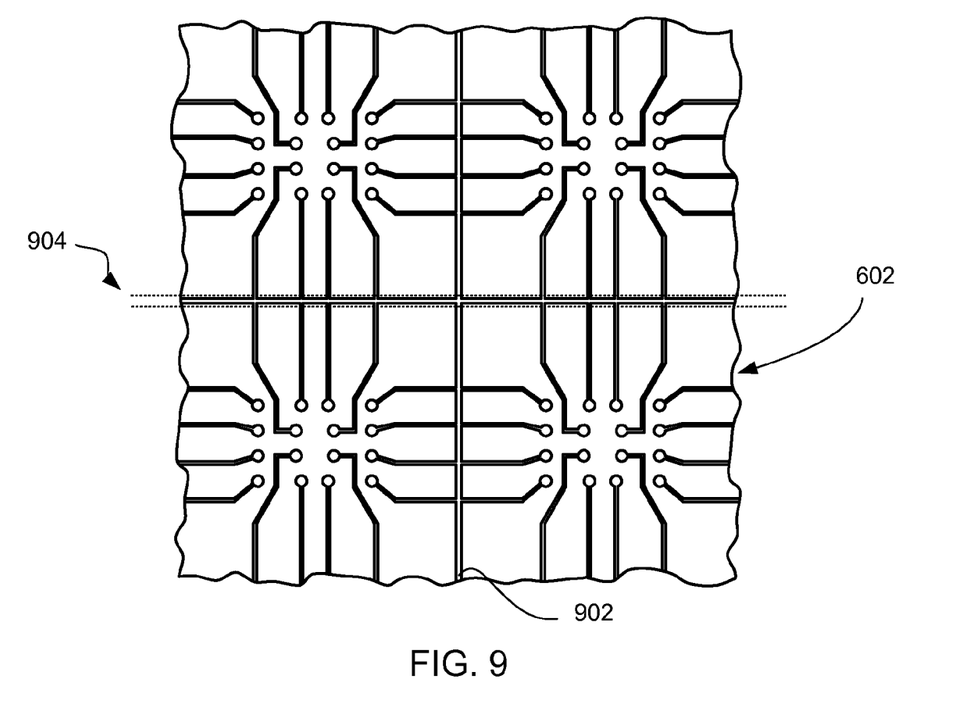
FIG. 9 is a top view of the integrated circuit packaging system of FIG. 8.

Referring now to FIG. 9, therein is shown a top view of the integrated circuit packaging system 100 of FIG. 8. The integrated circuit packaging system 100 is shown having the leadframe 602 linked with a tie-bar 902. Along the tie bar is a singulation path 904, along which the leadframe 602 may be separated and the tie-bar 902 removed in a later phase of manufacture.

Figure 10:
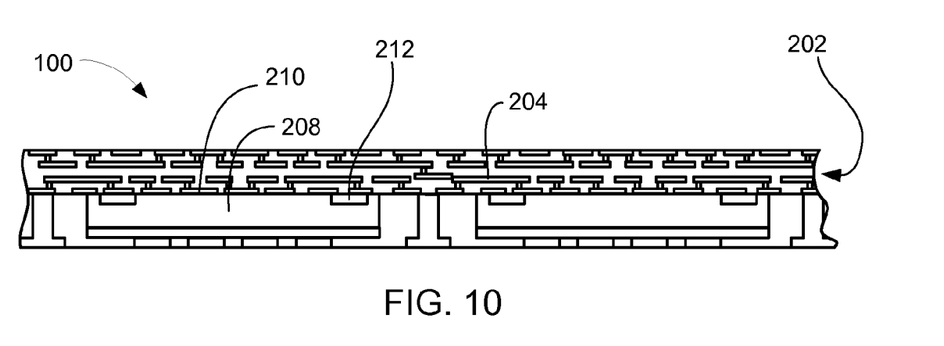
FIG. 10 is the integrated circuit packaging system of FIG. 2 after a buildup layer forming phase of manufacture.

Referring now to FIG. 10, therein is shown the integrated circuit packaging system 100 of FIG. 2 after a buildup layer forming phase of manufacture. The integrated circuit packaging system 100 is shown having the substrate 202 formed on the active side 210 of the integrated circuit 208 and having the conductive traces 204 of the substrate 202 connected to the contact pads 212 of the integrated circuit 208 and connected to the z-interconnects 220. The active side 210 of the integrated circuit 208 is exposed when the carrier 502 of FIG. 5 is removed.

Figure 11:
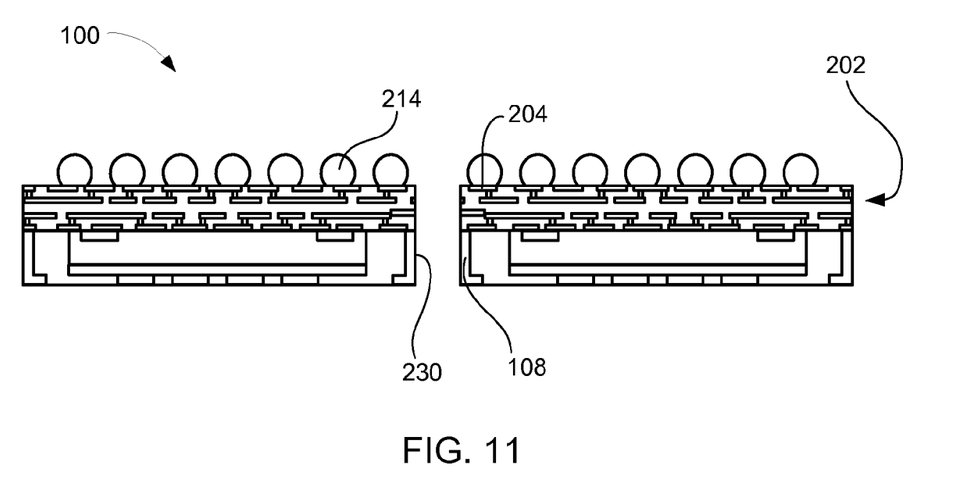
FIG. 11 is the integrated circuit packaging system of FIG. 2 after a singulation phase of manufacture.

Referring now to FIG. 11, therein is shown the integrated circuit packaging system 100 of FIG. 2 after a singulation phase of manufacture. The integrated circuit packaging system 100 is shown having the packages singulated and showing the exposed side 230 of the z-interconnect 220. The external interconnects 214 are shown plated to the conductive traces 204 in the substrate 202.

Figure 12:
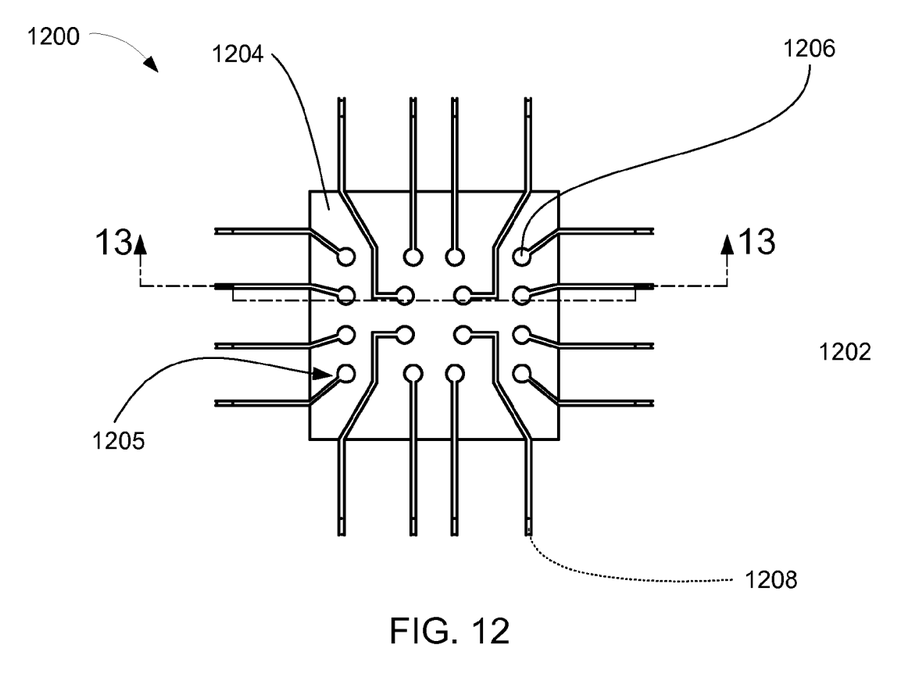
FIG. 12 is a top view of a trace encapsulation of an integrated circuit packaging system.

Referring now to FIG. 12, therein is shown a top view trace encapsulation of an integrated circuit packaging system 1200. The integrated circuit packaging system 1200 is shown having traces 1202. The traces 1202 are partially encapsulated by a trace encapsulation 1204 leaving a portion 1205 on contact points such as pads 1206 and the traces 1202.

The trace encapsulation 1204 helps to stabilize the traces 1202 during production. The traces 1202 connect the pads 1206 to the z-interconnects 1208 by routing them in an optimal way taking into consideration various factors such as conduction path length, external component terminal components, as well as various other factors.

Routed is defined as configuring the selected paths along which information is to be sent. In the present invention routed is defined and implemented as: configuring the pads 1206 to connect to external devices with various terminal configurations, and configuring the traces 1202 to connect with the z-interconnects 1208.

Configuring the pads 1206 and the traces 1202 reduces cost and production time by eliminating other components such as laminated interposers or buildup layers which would otherwise be used to interface with external components.

Figure 13:
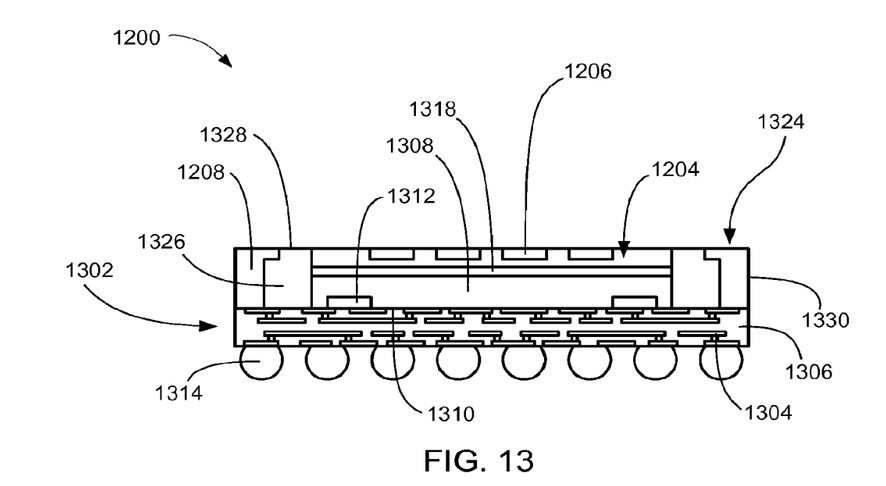
FIG. 13 is a cross-sectional view of an integrated circuit packaging system in a second embodiment of the present invention.

Referring now to FIG. 13, therein is shown a cross-sectional view of an integrated circuit packaging system 1300 in a second embodiment of the present invention. The integrated circuit packaging system 1300 is shown having a substrate 1302 such as a buildup layer. The buildup layer may be produced through alternating lithography processes, metallization, etch, and dielectric deposition processes.

This may produce a substrate 1302 having conducive traces 1304 isolated by a dielectric 1306 such as a low-k dielectric. Mounted above the substrate 1302 is an integrated circuit 1308 such as a flip chip with an active side 1310.

The active side 1310 of the integrated circuit 1308 faces the substrate 1302 and has contact pads 1312, which are connected to the conductive traces 1304 of the substrate 1302. Below the substrate 1302 external interconnects 1314 such as solder balls are formed and connect to the conductive traces 1304 of the substrate 1302.

Mounted above the integrated circuit 1308 are the pads 1206, of FIG. 12, partially encapsulated by the trace encapsulation 1204, of FIG. 12. The trace encapsulation 1204 is attached to the integrated circuit 1308 with a die attach adhesive 1318. The z-interconnects 1208, of FIG. 12, connect the pads 1206 to the conductive traces 1304 of the substrate 1302.

The pads 1206 are routed above the integrated circuit 1308, and may be configured to connect to external devices with different terminal configurations. The z-interconnects 1208 may surround the integrated circuit 1308 in a single row 1324. The pads 1206 may be configured directly above the integrated circuit 1308.

The integrated circuit 1308 is encapsulated with an encapsulation 1326. The encapsulation 1326 has an upper surface 1328 which is level with the pads 1206 exposing the pads 1206 from the encapsulation 1326. The encapsulation 1326 fills between the integrated circuit 1308 and the z-interconnects 1208.

The z-interconnects 1208 are also exposed from the encapsulation 1326 creating an exposed side 1330 on the z-interconnects 1208. The exposed side 1330 of the z-interconnect 1208 may be used as an additional external connection point when integrating the integrated circuit packaging system 1300 into a board level system.

Figure 14:
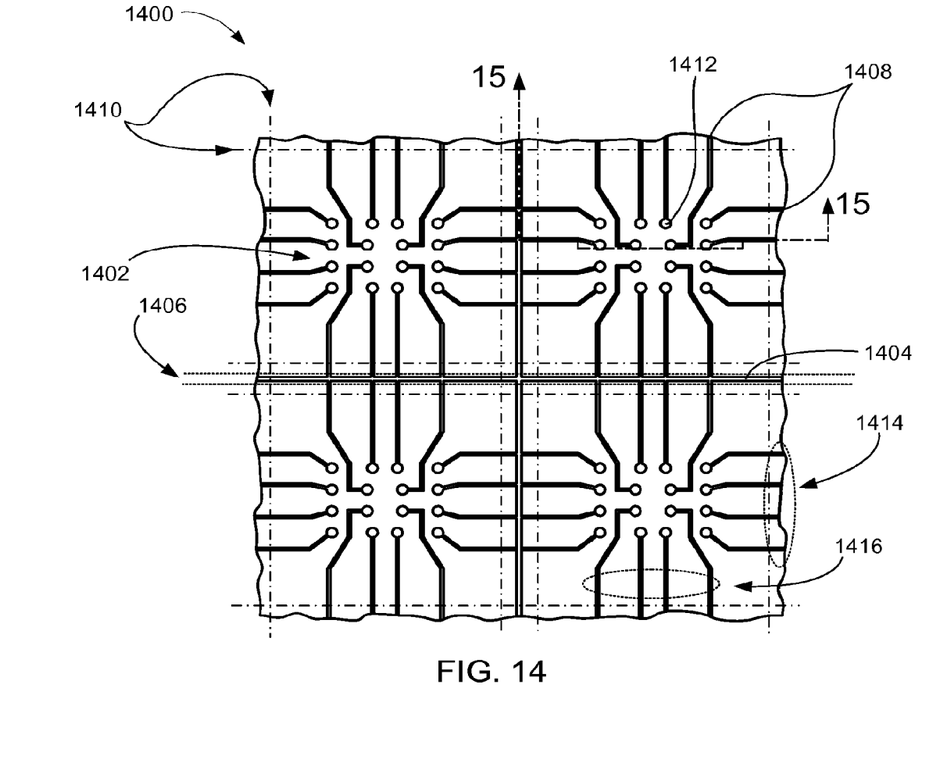
FIG. 14 is a top view of an integrated circuit packaging system in an embodiment of the present invention and after a planarizing phase of manufacture.

Referring now to FIG. 14, therein is shown a top view of an integrated circuit packaging system 1400 in an embodiment of the present invention and after a planarizing phase of manufacture. The integrated circuit packaging system 1400 is shown having a leadframe 1402. The leadframe 1402 has tie-bars 1404. Along either side of the tie-bars 1404 are singulation paths 1406. The singulation paths 1406 are shown just outside the tie-bars 1406 so that the tie-bars 1404 will be completely removed during singulation.

Around edges 1408 of the leadframe 1402 are etch lines 1410 which may be used to form contact points such as pads 1412 that are separate connection points on the leadframe 1402 and will be located in the regions 1414 along the edges 1408 of the leadframe 1402.

The leadframe 1402 is also shown having a z-interconnect region 1416. The z-interconnect region 1416 contains structures which connect the leadframe 1402 to other components in a vertical path.

Figure 15:
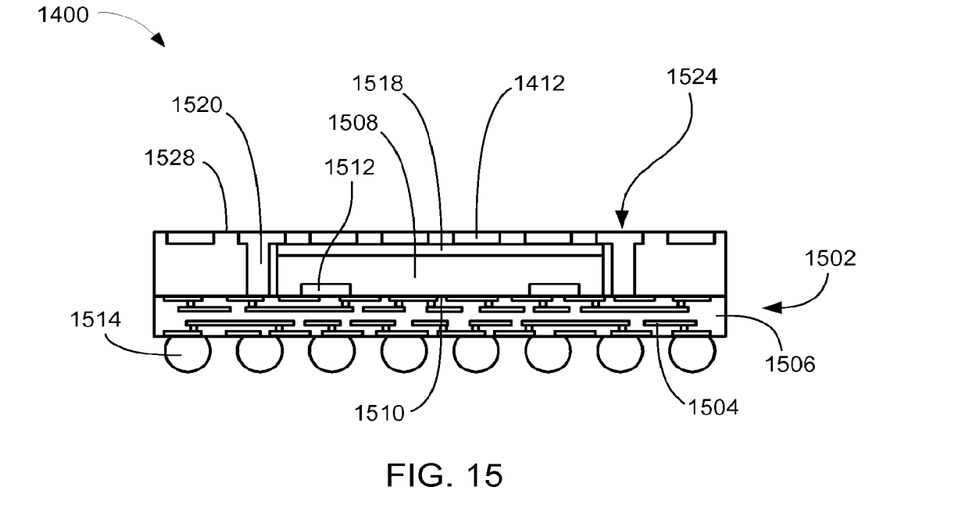
FIG. 15 is a cross-sectional view of the integrated circuit packaging system along the line 15-15 of FIG. 14 after a singulation phase of manufacture.

Referring now to FIG. 15, therein is shown a cross-sectional view of the integrated circuit packaging system 1400 along the line 1515 of FIG. 14 after a singulation phase of manufacture. The integrated circuit packaging system 1400 is shown having a substrate 1502 such as a buildup layer. The buildup layer may be produced through alternating lithography processes, metallization, etch, and dielectric deposition processes.

This may produce a substrate 1502 having conducive traces 1504 isolated by a dielectric 1506 such as a low-k dielectric. Mounted above the substrate 1502 is an integrated circuit 1508 such as a flip chip with an active side 1510.

The active side 1510 of the integrated circuit 1508 faces the substrate 1502 and has contact pads 1512, which are connected to the conductive traces 1504 of the substrate 1502. Below the substrate 1502 external interconnects 1514 such as solder balls are formed and connect to the conductive traces 1504 of the substrate 1502.

Mounted above the integrated circuit 1508 are the pads 1412. The pads 1412 are attached to the integrated circuit 1508 with a die attach adhesive 1518. Connecting the pads 1412 to the conductive traces 1504 of the substrate 1502 are z-interconnects 1520.

The pads 1412 are routed above the integrated circuit 1508, and may be configured to connect to external devices with different terminal configurations. The z-interconnects 1520 may surround the integrated circuit 1508 in a single row 1524. The pads 1412 may be routed directly above the integrated circuit 1508.

The pads 1412 or traces 1504 may also be fanned out peripheral to the z-interconnect 1520 and the integrated circuit 1508. "Fanned out" is defined as broadening the area of interconnections. Peripheral is defined as a location further from the integrated circuit 1508 than the z-interconnect 1520 on a horizontal plane. The pads 1412 which are fanned out around the single row 1524 to provide greater flexibility in configuring the pads 1412 to an external package which may require either a greater number of connections or an external package having a larger footprint. The traces 1504 may be cantilevered not over, but away from the integrated circuit 1508.

The integrated circuit 1508 is encapsulated with an encapsulation 1526. The encapsulation 1526 has an upper surface 1528 which is level with the pads 1412 exposing the pads 1412 from the encapsulation 1526.

Figure 16:
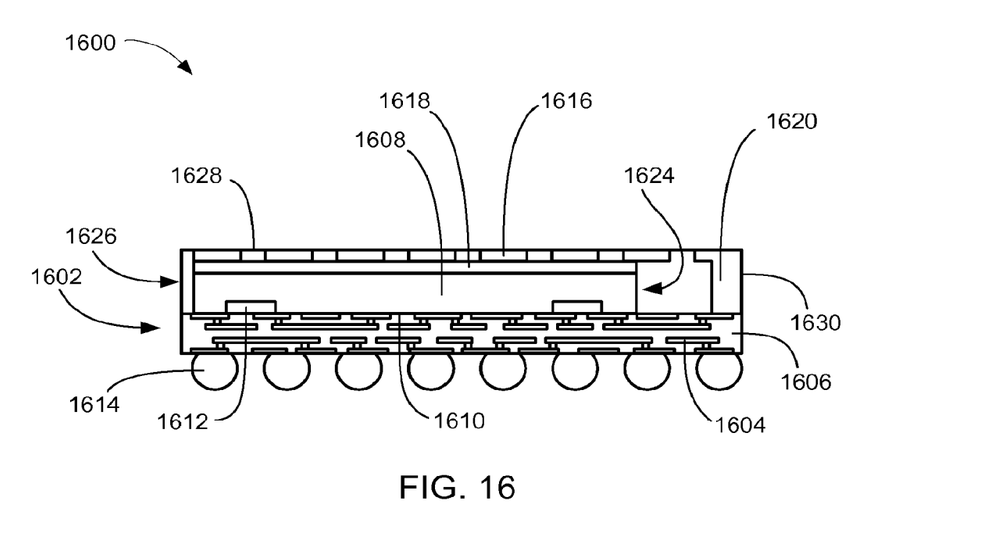
FIG. 16 is a cross-sectional view of an integrated circuit packaging system in a third embodiment of the present invention.

Referring now to FIG. 16, therein is shown a cross-sectional view of an integrated circuit packaging system 1600 in a third embodiment of the present invention. The integrated circuit packaging system 1600 is shown having a substrate 1602 such as a buildup layer. The buildup layer may be produced through alternating lithography processes, metallization, etch, and dielectric deposition processes.

This may produce a substrate 1602 having conducive traces 1604 isolated by a dielectric 1606 such as a low-k dielectric. Mounted above the substrate 1602 is an integrated circuit 1608 such as a flip chip with an active side 1610.

The active side 1610 of the integrated circuit 1608 faces the substrate 1602 and has contact pads 1612, which are connected to the conductive traces 1604 of the substrate 1602. Below the substrate 1602 external interconnects 1614 such as solder balls are formed and connect to the conductive traces 1604 of the substrate 1602.

Mounted above the integrated circuit 1608 are pads 1616. The pads 1616 are attached to the integrated circuit 1608 with a die attach adhesive 1618. The pads 1616 are connected to the conductive traces 1604 of the substrate with z-interconnects 1620.

The pads 1616 are routed above the integrated circuit 1608, and may be configured to connect to external devices with different terminal configurations. The z-interconnects 1620 may be mounted along one side 1624 of the integrated circuit 1608. The pads 1616 may be configured directly above the integrated circuit 1608.

The integrated circuit 1608 is encapsulated with an encapsulation 1626. The encapsulation 1626 has an upper surface 1628 which is level with the pads 1616 exposing the pads 1616 from the encapsulation 1626. The z-interconnects 1620 are also exposed from the encapsulation 1626 creating an exposed side 1630 on the z-interconnects 1620. The exposed side 1630 of the z-interconnect 1620 may be used as an additional external connection point when integrating the integrated circuit packaging system 1600 into a board level system.

Figure 17:
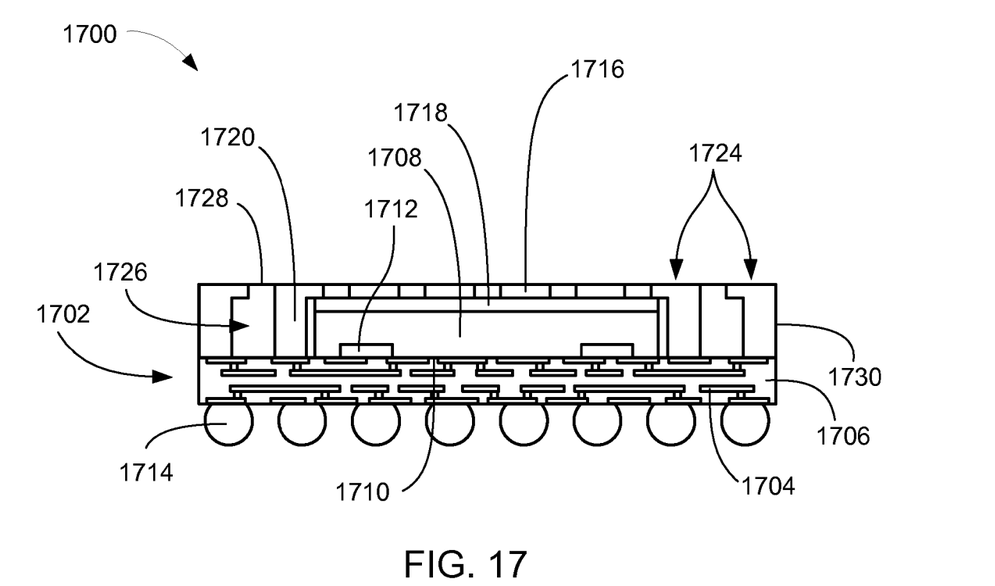
FIG. 17 is a cross-sectional view of an integrated circuit packaging system in a fourth embodiment of the present invention.

Referring now to FIG. 17, therein is shown a cross-sectional view of an integrated circuit packaging system 1700 in a fourth embodiment of the present invention. The integrated circuit packaging system 1700 is shown having a substrate 1702 such as a buildup layer. The buildup layer may be produced through alternating lithography processes, metallization, etch, and dielectric deposition processes.

This may produce a substrate 1702 having conducive traces 1704 isolated by a dielectric 1706 such as a low-k dielectric. Mounted above the substrate 1702 is an integrated circuit 1708 such as a flip chip with an active side 1710.

The active side 1710 of the integrated circuit 1708 faces the substrate 1702 and has contact pads 1712, which are connected to the conductive traces 1704 of the substrate 1702. Below the substrate 1702 external interconnects 1714 such as solder balls are formed and connect to the conductive traces 1704 of the substrate 1702.

Mounted above the integrated circuit 1708 are pads 1716. The pads 1716 are attached to the integrated circuit 1708 with a die attach adhesive 1718. The pads 1716 are connected to the conductive traces 1704 of the substrate with z-interconnects 1720.

The pads 1716 are routed above the integrated circuit 1708, and may be configured to connect to external devices with different terminal configurations. The z-interconnects 1720 may surround the integrated circuit 1708 in multiple rows 1724. The pads 1716 may be configured directly above the integrated circuit 1708.

The multiple rows 1724 of z-interconnects 1720 provide greater flexibility in configuring the pads 1716 to an external package which may require either a greater number of connections or an external package having a larger footprint.

The integrated circuit 1708 is encapsulated with an encapsulation 1726. The encapsulation 1726 has an upper surface 1728 which is level with the pads 1716 exposing the pads 1716 from the encapsulation 1726. The z-interconnects 1720 are also exposed from the encapsulation 1726 creating an exposed side 1730 on the z-interconnects 1720. The exposed side 1730 of the z-interconnect 1720 may be used as an additional external connection point when integrating the integrated circuit packaging system 1700 into a board level system.

Figure 18:
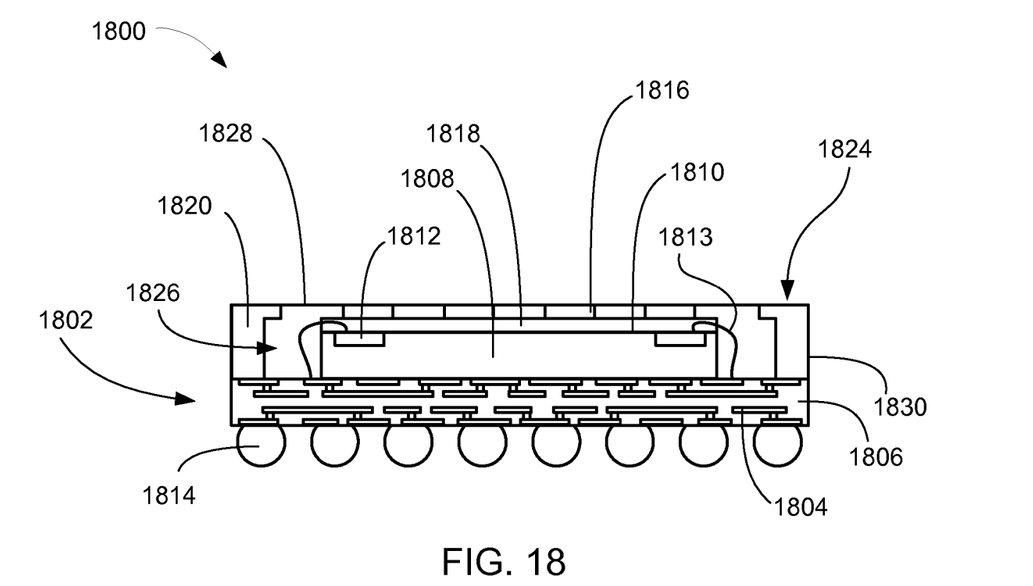
FIG. 18 is a cross-sectional view of an integrated circuit packaging system in a fifth embodiment of the present invention.

Referring now to FIG. 18, therein is shown a cross-sectional view of an integrated circuit packaging system 1800 in a fifth embodiment of the present invention. The integrated circuit packaging system 1800 is shown having a substrate 1802 such as a buildup layer. The buildup layer may be produced through alternating lithography processes, metallization, etch, and dielectric deposition processes.

This may produce a substrate 1802 having conducive traces 1804 isolated by a dielectric 1806 such as a low-k dielectric. Mounted above the substrate 1802 is an integrated circuit 1808 such as a wire-bonded die with an active side 1810.

The active side 1810 of the integrated circuit 1808 faces away from the substrate 1802 and has contact pads 1812, which are connected to the conductive traces 1804 of the substrate 1802 with interconnects 1813 such as bond wires. Below the substrate 1802 external interconnects 1814 such as solder balls are formed and connect to the conductive traces 1804 of the substrate 1802.

Mounted above the integrated circuit 1808 are pads 1816. The pads 1816 are attached to the integrated circuit 1808 with a wire-in-film adhesive 1818. The pads 1816 are connected to the conductive traces 1804 of the substrate with z-interconnects 1820.

The wire-in-film adhesive 1818 has a low viscosity and, as temperature increases, the viscosity gets lower. Therefore, the wire-in-film adhesive 1818 can be easily pressed over the bond wires 1813, above, and around the integrated circuit 1808 and then cured to harden the wire-in-film adhesive 1818.

It has been discovered that the wire-in-film adhesive 1818 should be a thermally conductive dielectric material. The wire-in-film adhesive 1818 can be made of a B-stage material that can be hardened after curing and can maintain a predetermined thickness. The leadframe 1816 has z-interconnects 1820 which connect pads 1816 to the conductive traces 1804 of the substrate 1802.

The pads 1816 are routed above the integrated circuit 1808, and may be configured to connect to external devices with different terminal configurations. The z-interconnects 1820 may surround the integrated circuit 1808 in a single row 1824. The pads 1816 may be configured directly above the integrated circuit 1808.

The integrated circuit 1808 is encapsulated with an encapsulation 1826. The encapsulation 1826 has an upper surface 1828 which is level with the pads 1816 exposing the pads 1816 from the encapsulation 1826. The z-interconnects 1820 are also exposed from the encapsulation 1826 creating an exposed side 1830 on the z-interconnects 1820. The exposed side 1830 of the z-interconnect 1820 may be used as an additional external connection point when integrating the integrated circuit packaging system 1800 into a board level system.

Figure 19:
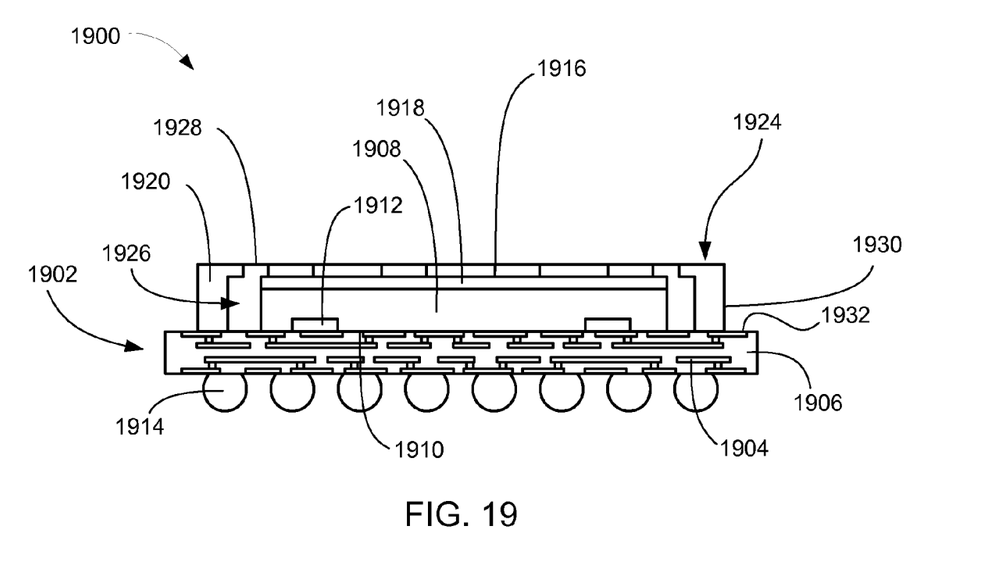
FIG. 19 is a cross-sectional view of an integrated circuit packaging system in a sixth embodiment of the present invention.

Referring now to FIG. 19, therein is shown a cross-sectional view of an integrated circuit packaging system 1900 in a sixth embodiment of the present invention. The integrated circuit packaging system 1900 is shown having a substrate 1902 such as a buildup layer. The buildup layer may be produced through alternating lithography processes, metallization, etch, and dielectric deposition processes.

This may produce a substrate 1902 having conducive traces 1904 isolated by a dielectric 1906 such as a low-k dielectric. Mounted above the substrate 1902 is an integrated circuit 1908 such as a flip chip with an active side 1910.

The active side 1910 of the integrated circuit 1908 faces the substrate 1902 and has contact pads 1912, which are connected to the conductive traces 1904 of the substrate 1902. Below the substrate 1902 external interconnects 1914 such as solder balls are formed and connect to the conductive traces 1904 of the substrate 1902.

Mounted above the integrated circuit 1908 are pads 1916. The pads 1916 are attached to the integrated circuit 1908 with a die attach adhesive 1918. The pads 1916 are connected to the conductive traces 1904 of the substrate with z-interconnects 1920.

The pads 1916 may be configured to connect to external devices with different terminal configurations. The z-interconnects 1920 may surround the integrated circuit 1908 in a single row 1924. The pads 1916 may be configured directly above the integrated circuit 1908.

The integrated circuit 1908 is encapsulated with an encapsulation 1926. The encapsulation 1926 has an upper surface 1928 which is level with the pads 1916 exposing the pads 1916 from the encapsulation 1926. The z-interconnects 1920 are also exposed from the encapsulation 1926 creating an exposed side 1930 on the z-interconnects 1920. The exposed side 1930 of the z-interconnect 1920 may be used as an additional external connection point when integrating the integrated circuit packaging system 1900 into a board level system.

The substrate 1902 has an exposed upper surface 1932, which is also exposed from the encapsulation 1926. The exposed upper surface 1932 of the substrate 1902 may be used to provide additional connection points.

Figure 20:
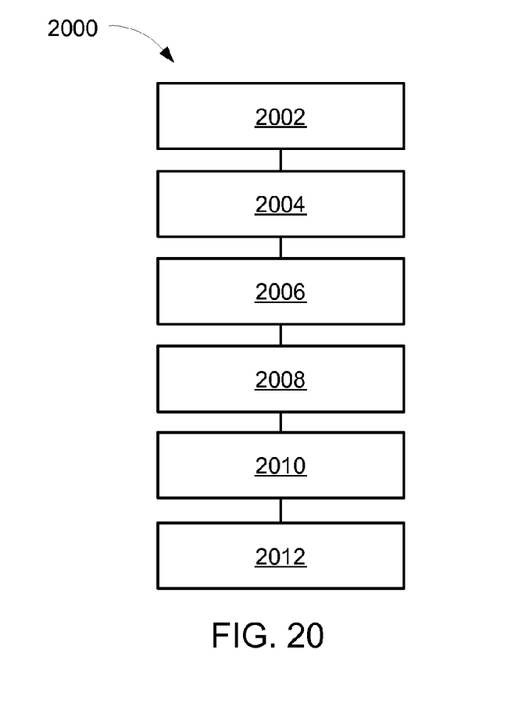
FIG. 20 is a flow chart of a method of manufacture of an integrated circuit packaging system in a further embodiment of the present invention.

Referring now to FIG. 20, therein is shown a flow chart of a method 2000 of manufacture of an integrated circuit packaging system 100 of FIG. 1 in a further embodiment of the present invention. The method 2000 includes providing a carrier in a block 2002; mounting an integrated circuit on the carrier in a block 2004; mounting a z-interconnect on the carrier, the z-interconnect for supporting a trace cantilevered over the integrated circuit in a block 2006; encapsulating the integrated circuit with an encapsulation in a block 2008; removing the carrier in a block 2010; and depositing a substrate below the integrated circuit in a block 2012.

It has been discovered that the present invention thus has numerous aspects.

A principle aspect that has been discovered is that the present invention is, by having routed pads on a pre-formed leadframe top build-up layers for stacking external devices may be eliminated thus reducing production costs and time.

Another aspect is the z-interconnect of the present invention may replace expensive through vias of other designs.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the leadframe interposer system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a carrier;
mounting an integrated circuit on the carrier;
mounting a z-interconnect on the carrier;
cantilevering a trace over the integrated circuit of the z-interconnect;
attaching the trace to the integrated circuit with a die attach adhesive, a wire-in-film adhesive, or a combination thereof;
encapsulating the integrated circuit with an encapsulation;
removing the carrier;
connecting a substrate below the integrated circuit;
forming an external interconnect mounted below the substrate; and
connecting an external device to the trace.

2. The method as claimed in claim 1 further comprising:
encapsulating the trace in a trace encapsulation leaving a portion of the trace exposed from the trace encapsulation; or
wherein:
encapsulating the integrated circuit with the encapsulation includes partially encapsulating the trace, the z-interconnect, or a combination thereof.

3. The method as claimed in claim 1 further comprising:
cantilevering a trace away from the integrated circuit of the z-interconnect.

4. The method as claimed in claim 1 wherein:
mounting the z-interconnects includes mounting the z-interconnect: along one side of the integrated circuit, surrounding the integrated circuit in a single row, surrounding the integrated circuit in multiple rows, or a combination thereof.

5. A method of manufacture of an integrated circuit packaging system comprising:
providing a carrier;
mounting integrated circuits on the carrier;
mounting a leadframe on the carrier, the leadframe having a z-interconnect;
cantilevering a trace over the integrated circuits of the z-interconnect;
attaching the trace to the integrated circuits with a die attach adhesive, a wire-in-film adhesive, or a combination thereof;
encapsulating the integrated circuits and at least a portion of the leadframe with an encapsulation;
removing the carrier;
connecting a substrate below the integrated circuits;
singulating the encapsulation to remove the leadframe;
forming an external interconnect mounted below the substrate; and
connecting an external device to the trace.

6. The method as claimed in claim 5 wherein
connecting the external device includes connecting the external device to the trace with a solder ball, a bond wire, or a combination thereof.

7. The method as claimed in claim 5 further comprising:
mounting an external device above the substrate; and
wherein:
mounting the external device includes mounting a flip chip, a wire-bonded package, a wafer level chip scale package, or passive components.

8. The method as claimed in claim 5 wherein:
encapsulating at least a portion of the leadframe includes retaining an exposed upper surface not covered by the encapsulation.

9. An integrated circuit packaging system comprising:
a substrate;
an integrated circuit mounted on the substrate;
an external interconnected mounted below the substrate;
a z-interconnect mounted on the substrate, the z-interconnect for supporting a trace cantilevered over the integrated circuit;
a trace cantilevered over the integrated circuit of the z-interconnect;
a die attach adhesive, a wire-in-film adhesive, or a combination thereof attaching the trace to the integrated circuit;
an encapsulation encapsulating the integrated circuit; and
an external device connected to the trace.

10. The system as claimed in claim 9 further comprising:
a trace encapsulation encapsulating the trace leaving a portion of the trace exposed from the trace encapsulation; or
wherein:
the encapsulation includes partially encapsulating the trace, the z-interconnect, or a combination thereof.

11. The system as claimed in claim 9 further comprising:
a second trace cantilevered away from the integrated circuit.

12. The system as claimed in claim 9 further comprising:
underfill filling between the encapsulation and the external device.

13. The system as claimed in claim 9 wherein:
the z-interconnect is mounted: along one side of the integrated circuit in a single row surrounding the integrated circuit, in multiple rows surrounding the integrated circuit, or a combination thereof.

14. The system as claimed in claim 9 further comprising:
a solder ball, a bond wire, or a combination thereof connecting the external device to the trace.

15. The system as claimed in claim 9 wherein:
the external device is a flip chip, a wire-bonded package, a wafer level chip scale package, or passive components.

16. The system as claimed in claim 9 wherein:
the substrate has an exposed upper surface not covered by the encapsulation.

* * * * *

UNITED STATES PATENT AND TRADEMARK OFFICE
CERTIFICATE OF CORRECTION

| | | |
|---|---|---|
| PATENT NO. | : 8,003,445 B2 | Page 1 of 1 |
| APPLICATION NO. | : 12/412312 | |
| DATED | : August 23, 2011 | |
| INVENTOR(S) | : Pagaila et al. | |

It is certified that error appears in the above-identified patent and that said Letters Patent is hereby corrected as shown below:

Column 7:
line 17, delete "line 1515" and insert therefor --line 15—15--

Column 11:
claim 4, lines 39-40, delete "z-interconnect: along" and insert therefor --z-interconnect along--

Column 12:
claim 6, line 4, delete "wherein" and insert therefor --wherein:-- claim 9, line 21, delete "interconnected" and insert therefor --interconnect--

Signed and Sealed this
Twenty-eighth Day of February, 2012

David J. Kappos
*Director of the United States Patent and Trademark Office*